United States Patent [19]

Crawford

[11] 4,096,362
[45] Jun. 20, 1978

[54] AUTOMATIC CABLE BALANCING NETWORK

[75] Inventor: Charles David Crawford, Burlington, N.C.

[73] Assignee: Bell Telephone Laboratories, Incorporated, Murray Hill, N.J.

[21] Appl. No.: 808,091

[22] Filed: Jun. 20, 1977

[51] Int. Cl.² .............................................. H04B 1/52
[52] U.S. Cl. ................................................ 179/170 D
[58] Field of Search .................................... 179/170 D

*Primary Examiner*—George G. Stellar
*Attorney, Agent, or Firm*—Thomas Stafford

[57] ABSTRACT

A hybrid circuit for coupling a bidirectional telephone cable to two unidirectional cables is balanced automatically by employing an adjustable balance network and a control circuit. Optimum adjustment of the balance network is achieved over a frequency band of interest by employing a signal source having one or more frequency components within the frequency band of interest and by generating signals for controlling magnitude and phase components in the balance network. The magnitude control signal is representative of the difference between the absolute magnitudes of signals detected at the bidirectional cable connection to the hybrid and at the balance network connection to the hybrid in the frequency band of interest. Signals for controlling the phase components of the balance network are representative of the difference between the absolute magnitudes of the detected signals modified by a first prescribed weighting function less a component proportional to the phase difference between the detected signals modified by a second prescribed weighting function within the frequency band of interest. The weighting functions are obtained by employing a filter having a prescribed low-pass characteristic. The component values of the filter are determined by the locations of adjustable pole(s) and/or zero(s) within the frequency band. The filter characteristic may be adjusted during the balance process further to optimize the balance network adjustments.

17 Claims, 5 Drawing Figures

AUTOMATIC CABLE BALANCING NETWORK

BACKGROUND OF THE INVENTION

This invention relates to wave transmission and, more particularly, to circuit arrangements for automatically balancing hybrid networks.

Hybrid networks are commonly used in bidirectional signal transmission systems to couple signals from a bidirectional transmission path to incoming and outgoing unidirectional transmission paths, a typical example being in coupling a 2-wire telephone transmission path to a 4-wire telephone transmission arrangement. As is well known, in such arrangements it is necessary to balance the hybrid by employing a network having an impedance which substantially matches the impedance of the bidirectional transmission path. Otherwise, low transhybrid loss results which, in turn, typically results in unwanted signal reflections.

Bidirectional transmission paths of various lengths are employed in communications systems and, therefore, present a wide range of impedances. Consequently, it has been necessary to provide precision hybrid balance networks including various manual adjustments in order to match the impedance of the particular bidirectional path being connected to the hybrid. Such manual adjustments rely heavily on knowledge of the characteristics of the particular bidirectional transmission path being connected to the hybrid. Needless to say, such knowledge is not always readily available. Moreover, the manual adjustment can result in mismatch through human error.

More recently, automatic balancing arrangements have been proposed in an attempt at overcoming the limitations of the prior manually adjusted balance networks. To this end, an arrangement has been proposed which employs an impedance network having an adjustable scalar multiplier, i.e., magnitude adjustment, and either an adjustable real zero or an adjustable real pole in conjunction with fixed real poles and/or fixed real zeros. The balance network is connected to a predetermined port of a 4-port hybrid as are a bidirectional transmission path and two unidirectional transmission paths. A single frequency test signal is applied at one of the unidirectional paths to the hybrid and a sense circuit generates two control signals. A first control signal represents the difference between the magnitudes of signals developed at the hybrid ports connected to the bidirectional path and the balance network, while a second control signal represents the difference in phase between those signals. The first control signal is employed to adjust the scalar multiplier while the second control signal is employed to adjust either the pole or the zero depending on the particular balance network being employed. The control signal values are stored and employed to maintain the adjustments of the balance network. One limitation of such an arrangement is that the impedance adjustments have been, at best, optimized for a single frequency. As is well known, most communication paths operate over some band of frequencies, for example, the voice frequency band. Another limitation of this prior arrangement is that it can adjust only one pole or one zero. Moreover, the pole or zero adjustment control signal is merely a function of the phase difference between the sensed voltages at a single frequency. It will be apparent that use of such a pole or zero control signal results in less than an optimum impedance match. Additionally, in certain applications it is desirable to have both an adjustable pole and an adjustable zero. Thus, although the prior automatic balance network may function satisfactorily in some applications, it is undesirable for others, especially in those applications in which balance is desired over the frequency band of the particular communications path.

SUMMARY OF THE INVENTION

These and other limitations of prior hybrid balance networks are overcome by employing the principles of the invention to be described herein in an automatic hybrid balancing network.

A closer match of the impedance of a bidirectional transmission path connected to a hybrid network is obtained by employing a test signal having one or more frequency components in a frequency band of interest and an automatic adjustable balance network having at least an adjustable magnitude component, for example, an adjustable gain, and an adjustable phase component, for example, an adjustable singularity, i.e., adjustable real pole or real zero, in addition to other fixed real pole(s) and/or fixed real zero(s).

A control circuit responsive to signals detected at the hybrid connection to the bidirectional path and at the hybrid connection to the balance network generates control signals for optimizing the balance network adjustments over the frequency band of interest. The magnitude control signal is representative of the difference between the absolute magnitudes of the detected signals over the frequency band of interest and the phase component control signal is representative of the difference between the absolute magnitudes of the detected signals modified by a first prescribed weighting function less a component proportional to the phase difference between the detected signals modified by a second prescribed weighting function, all over the frequency band of interest. Thus, the phase component control, i.e., singularity, includes both magnitude and phase components each of which is modified by a weighting function.

The weighting functions are realized by employing a filter having a prescribed attenuation and phase versus frequency characteristic. In order to further optimize the balance network adjustments the characteristic of the filter is also adjusted during the balance process.

In a particular embodiment of the invention the desired impedance match is realized by employing a 4-port hybrid network to which a bidirectional transmission path to be matched is connected to a first port; a noise source is selectively connected to a second port; an adjustable balance network is connected to a third port; and a control signal generating circuit is connected via bandpass filters to sense signals developed at the first and third hybrid ports in response to the signal from the noise source, impedance of the bidirectional transmission path and impedance of the balance network. The detected signals are limited via the bandpass filters to the frequency band of interest. Impedances connected to the second and fourth hybrid ports during the balance network adjustment process are of first and second prescribed values, respectively, so that the signals developed at the first and third ports in response to the test signal, bidirectional transmission path impedance and balance network impedance approximate those determined to generate optimum control signals over the frequency band of interest for adjusting corresponding impedance elements in the balance network.

Adjustment of the impedance elements in the balance network effects corresponding variations in magnitude and frequency location of the adjustable real pole and adjustable real zero. These signals are employed to obtain at least a magnitude control signal, a real zero control signal and a real pole control signal. In one embodiment of the invention, the magnitude control signal represents the difference in the absolute magnitudes of the detected signals over the frequency band of interest. The real zero control signal represents the difference between the absolute magnitudes of the detected signals modified by a first weighting function less the difference between the phase of the detected signals modified by a second weighting function over the frequency band of interest. The weighting functions are realized by employing a filter having prescribed attenuation and phase characteristics. The real pole control signal also represents the difference between the absolute magnitudes of the detected signals modified by a third weighting function less the difference between the phase of the detected signals modified by a fourth weighting function, over the frequency band of interest. Here again, a filter having a prescribed filter characteristic is employed to obtain the desired weighting functions.

In a specific embodiment of the invention the filter characteristic is adjusted to track substantially variations in the associated control signal over the frequency band further to optimize the resulting control signal.

In another particular embodiment of the invention only a magnitude control and real zero control are employed to effect the desired balance function.

BRIEF DESCRIPTION OF THE DRAWINGS

These and other objects and advantages of the invention will be more fully understood from the following detailed description of illustrative embodiments taken in connection with the appended drawings in which.

DETAILED DESCRIPTION

Figure 1:
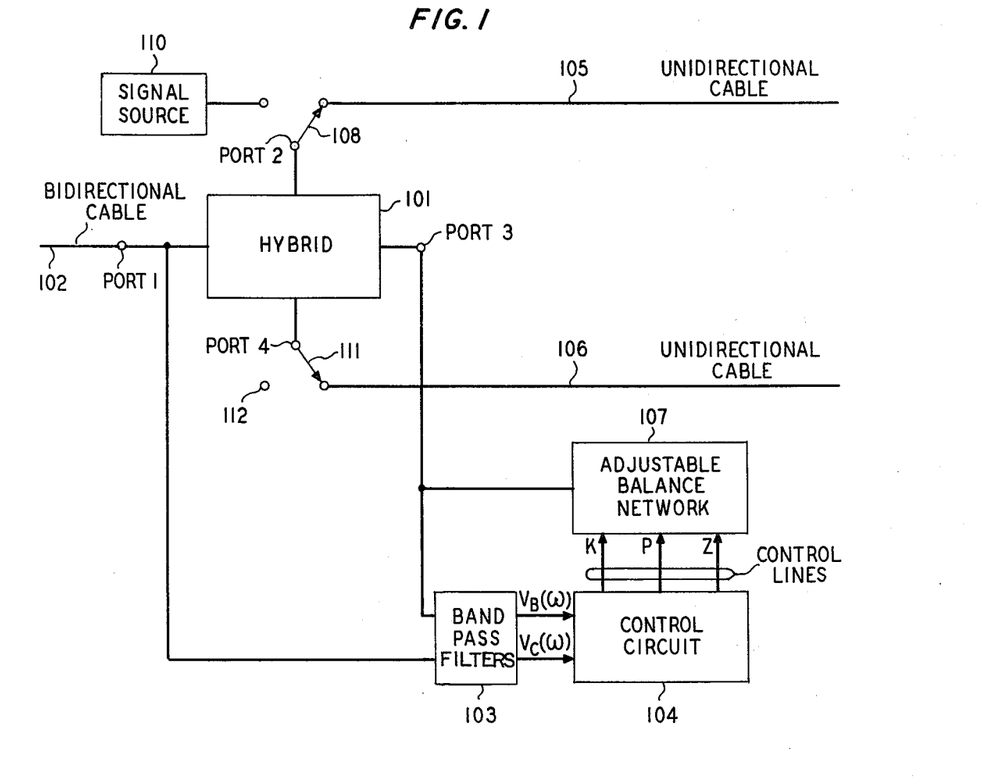
FIG. 1 depicts in simplified block diagram form a hybrid arrangement employing the instant invention.

FIG. 1 shows in simplified block diagram form a hybrid arrangement employing the instant invention. Accordingly, shown is a 4-port hybrid network 101 which may be a transformer arrangement of a type now well known in the art. Port 1 of hybrid 101 is adapted to be connected to a bidirectional transmission path, for example, a 2-wire bidirectional telephone cable 102, and via one of bandpass filters 103 to control circuit 104. Ports 2 and 4 are adapted to be connected to unidirectional transmission paths, for example, 2-wire telephone cables 105 and 106. Port 3 is connected to adjustable balance network 107 and also via one of filters 103 to control circuit 104. Port 2 is also adapted to be controllably connected via switch 108 to signal source 110, while port 4 is adapted to be controllably connected via switch 111 to a predetermined impedance termination, for example, an infinite impedance as indicated by an open circuit at terminal 112. During normal signal transmission hybrid 101 is connected as shown in FIG. 1 to unidirectional paths 105 and 106. However, during installation, i.e., connection to bidirectional cable 102, switches 108 and 111 connect ports 2 and 4 to signal source 110 and terminal 112, respectively. Control circuit 104 generates a plurality of control signals which are supplied via control lines K, P and Z to adjustable balance network 107. Although control circuit 104 is shown as generating three control signals, it is to be understood that more or fewer control signals may be generated in various embodiments of the invention depending on the type of balance network being adjusted. For example, a balance network for nonloaded telephone cable may have three adjustments, namely, magnitude, a real pole and a real zero, while a balance network for loaded telephone cable may have only two adjustments, namely, a magnitude and a real zero. It is noted that the real pole is a singularity in an impedance function Z while the real zero is a singularity in the admittance function Y, where $Z = 1/Y$.

Operation of this embodiment of the invention to generate control signals for automatically adjusting balance network 107 is best explained by a theoretical discussion of how the control signals are generated for optimizing the balance network adjustments over the frequency band of interest. In this example, a scalar multiplier, i.e., magnitude control signal K, real pole control signal P and real zero control signal Z, are generated to adjust network 107 to "match" substantially the impedance of bidirectional cable 102 over the entire frequency band of interest. It is noted that the impedance match is optimized within the capability of the balancing network and is not necessarily an exact match.

Figure 2:
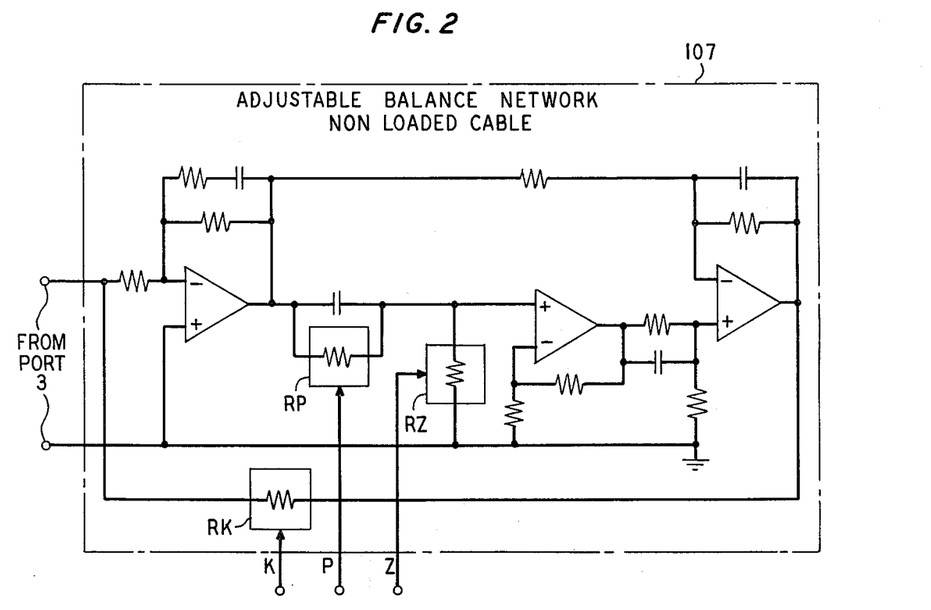
FIG. 2 shows details of a first adjustable balance network which may be employed in the arrangement of FIG. 1.
Figure 5:
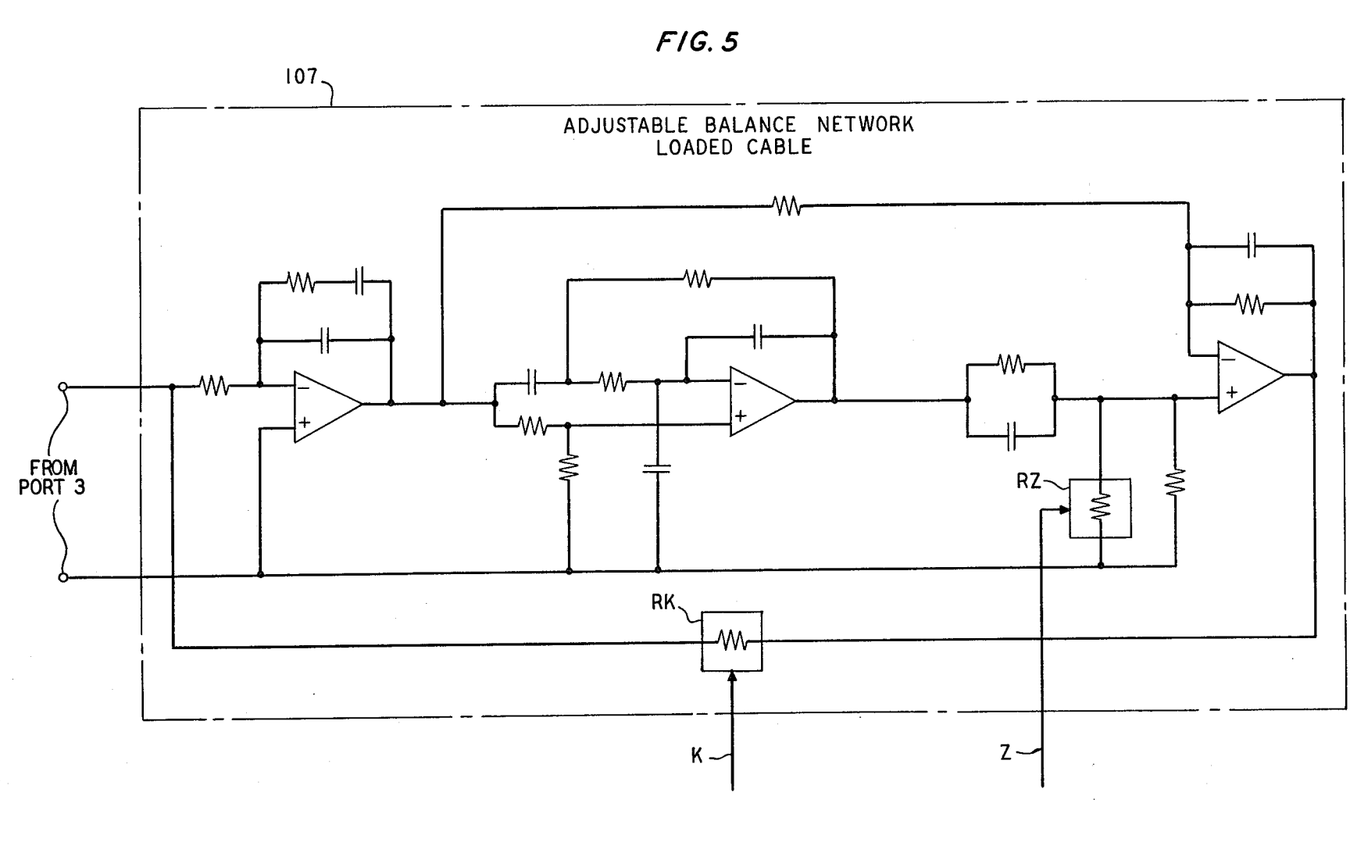
FIG. 5 shows details of a second adjustable balance network which may be employed in the arrangement of FIG. 1.

As indicated above, balance network 107 may have fewer controls and may also include other fixed real poles and/or real zeros, as will be apparent to those skilled in the art from observation of the balance network details shown in FIG. 2 and FIG. 5. Indeed, the principles of the invention to be discussed herein are equally applicable to generate control signals for adjusting any desired number of impedance elements. However, in the instant applications of the invention generation of three control signals will be discussed, namely, K, P and Z. In one application all three control signals are employed, namely, K, P and Z while in another application only K and Z are employed.

As is known, the impedance of a bidirectional transmission path, for example, a 2-wire telephone cable, is complex and, therefore, is dependent on the frequency of signals applied thereto. Thus, the cable impedance includes both magnitude and phase components which vary as the frequency varies. In practice, it is desired to design or adjust a balance network to yield a driving point impedance which will best match the cable impedance and, hence, yield the best, i.e., highest return loss between cable impedance $Z_C$ and balance network impedance $Z_B$ over the entire frequency band of interest and not necessarily at a single frequency.

Return loss (RL) is defined at a single frequency as $$RL(\omega) = -LOG_{10} \left| \frac{\vec{Z_C}(\omega) - \vec{Z_B}(\omega)}{\vec{Z_C}(\omega) + \vec{Z_B}(\omega)} \right|^2$$

However, in this example we are concerned with return loss over a frequency band, for example, a voice frequency band, of approximately 250 Hz to 3600 Hz. Such a return loss is commonly referred to as weighted return loss (WRL) and may be defined for discrete frequency components as $$WRL(N,\omega_i) = -10 \text{ LOG}_{10} \left[ \frac{\sum_{i=1}^{N} W_i \left| \frac{\vec{Z}_C(\omega_i) - \vec{Z}_B(\omega_i)}{\vec{Z}_C(\omega_i) + \vec{Z}_B(\omega_i)} \right|^2}{\sum_{i=1}^{N} W_i} \right] \quad (2)$$

where $\omega_i$ are frequencies ($2\pi f_i$) in the frequency band of interest and $W_i$ are weights assigned to the return loss at frequencies $\omega_i$.

Weighted return loss (WRL) is defined for analog signals as $$WRL = -10 \text{ LOG}_{10} \left[ \frac{\int_{\omega_1}^{\omega_2} W(\omega) \left| \frac{\vec{Z}_C(\omega) - \vec{Z}_B(\omega)}{\vec{Z}_C(\omega) + \vec{Z}_B(\omega)} \right|^2 d\omega}{\int_{\omega_1}^{\omega_2} W(\omega) d\omega} \right] \quad (3)$$

where $\omega$ are frequencies ($2\pi f$) in the frequency band of interest, i.e., $\omega_1$ to $\omega_2$, and $W(\omega)$ are weights assigned to the return loss at frequencies $\omega$.

By choosing appropriate values for $W(\omega)$ a measure of a desired return loss value is obtained, for example, echo return loss (ERL).

In one application it is desired to use flat weighted frequency components, i.e., $W(\omega)$ is constant over the frequency band of interest. Thus, letting $$W(\omega) = 1 \quad \omega_1 \leq \omega \leq \omega_2,$$

and $$W(\omega) = 0 \text{ OTHERWISE} \quad (4)$$

an expression of flat weighted return loss (FWRL) is obtained, namely $$FWRL = -10 \text{ LOG} \left[ \frac{\int_{\omega_1}^{\omega_2} \left| \frac{\vec{Z}_C(\omega) - \vec{Z}_B(\omega)}{\vec{Z}_C(\omega) + \vec{Z}_B(\omega)} \right|^2 d\omega}{(\omega_2 - \omega_1)} \right] \quad (5)$$

Then, letting $$X = \int_{\omega_1}^{\omega_2} \left| \frac{\vec{Z}_C(\omega) - \vec{Z}_B(\omega,K,Z,P)}{\vec{Z}_C(\omega) + \vec{Z}_B(\omega,K,Z,P)} \right| d\omega \quad (6)$$

equation 5 can be written $$FWRL = -10 \text{ LOG } X + 10 \text{ LOG } [\omega_2 - \omega_1] \quad (7)$$

Thus, it is apparent that to maximize FWRL, X must be minimized. This is realized in well-known fashion by taking partial differential equations of X with respect to each of K, Z and P and setting each partial differential equation equal to zero. This operation yields the optimizing criteria for K, Z and P as functions of $\vec{Z}_B(\omega)$ and $\vec{Z}_C(\omega)$ as follows:

$$K: \int_{\omega_1}^{\omega_2} \frac{|\vec{Z}_C(\omega)| - |\vec{Z}_B(\omega)|}{|\vec{Z}_C(\omega)| + |\vec{Z}_B(\omega)|} d\omega = 0 \quad (8)$$

$$Z: \int_{\omega_1}^{\omega_2} \left[ \frac{|\vec{Z}_C(\omega)| - |\vec{Z}_B(\omega)|}{|\vec{Z}_C(\omega)| + |\vec{Z}_B(\omega)|} W_1 - \frac{\theta(\omega)}{2} W_2 \right] d\omega = 0 \quad (9)$$

where $W_1 = Z/(\omega^2 + Z^2)$, $W_2 = \omega/(\omega^2 + Z^2)$, and $\theta(\omega)$ is the phase angle between $\vec{Z}_C(\omega)$ and $\vec{Z}_B(\omega)$.

$$P: \int_{\omega_1}^{\omega_2} \left[ \frac{|\vec{Z}_C(\omega)| - |\vec{Z}_B(\omega)|}{|\vec{Z}_C(\omega)| + |\vec{Z}_B(\omega)|} W_3 - \frac{\theta(\omega)}{2} W_4 \right] d\omega = 0 \quad (10)$$

where $W_3 = P/(\omega^2 + P^2)$ and $W_4 = \omega/(\omega^2 + P^2)$.

A transformer hybrid, for example, hybrid 101 having impedance $Z_C$ connected to port 1, impedance $Z_B$ connected to port 3, a signal source V1 with output impedance R1 connected to port 2, and an impedance R2 connected to port 4, yields $$V_C = \frac{\kappa V_1 [Z_B + 2\kappa^2 R_2] Z_C}{[Z_C + \kappa^2(R_1 + R_2)][Z_B + \kappa^2(R_1 + R_2)] - \kappa^4(R_2 - R_1)^2} \quad (11)$$

$$V_B = \frac{\kappa V_1 [Z_C + 2\kappa^2 R_2] Z_B}{[Z_C + \kappa^2(R_1 + R_2)][Z_B + \kappa^2(R_1 + R_2)] - \kappa^4(R_2 - R_1)^2} \quad (12)$$

$$E_4 = \frac{\kappa^2 V_1 [Z_C - Z_B] R_2}{[Z_C + \kappa^2(R_1 + R_2)][Z_B + \kappa^2(R_1 + R_2)] - \kappa^4(R_2 - R_1)^2} \quad (13)$$

where $V_C$ is the signal developed across port 1 of the hybrid, $V_B$ is the signal developed across port 3 of the hybrid, $E_4$ is the signal developed across port 4, and $\kappa$ is the turns ratio of the transformer.

Letting $R_1 \to 0$ and $R_2 \to \infty$, equations 11 and 12 reduce to $$V_C(\omega) = \frac{2\kappa V_1 Z_C(\omega)}{Z_C(\omega) + Z_B(\omega)} \quad (14)$$

$$V_B(\omega) = \frac{2\kappa V_1 Z_B(\omega)}{Z_C(\omega) + Z_B(\omega)} \quad (15)$$

$$E_4(\omega) = V_1 \frac{[Z_C(\omega) - Z_B(\omega)]}{[Z_C(\omega) + Z_B(\omega)]} \quad (16)$$

Comparing the expressions for $V_C(\omega)$ and $V_B(\omega)$ in equations 14–16 to the optimizing criteria of equations 8–10, and comparing the expression for $E_4(\omega)$ to that for return loss of equation 1, it can be shown that the optimizing criteria for K, Z and P may be expressed as:

$$K: \int_{\omega_1}^{\omega_2} [|\vec{V}_C(\omega)| - |\vec{V}_B(\omega)|] d\omega = 0 \quad (17)$$

$$Z: \int_{\omega_1}^{\omega_2} \left[ [|\vec{V}_C(\omega)| - \vec{V}_B(\omega)|] W_1 - \kappa V_1 \theta(\omega) W_2 \right] d\omega = 0 \quad (18)$$

where $W_1 = Z/(\omega^2 + Z^2)$, $W_2 = \omega/(\omega^2 + Z^2)$ and $\theta(\omega)$ is the phase angle between $\vec{V}_C(\omega)$ and $\vec{V}_B(\omega)$.

$$P: \int_{\omega_1}^{\omega_2} \left[ [|\vec{V}_C(\omega)| - |\vec{V}_B(\omega)|] W_3 - \kappa V_1 \theta(\omega) W_4 \right] d\omega = 0 \quad (19)$$

where $W_3 = P/(\omega^2 + P^2)$ and $W_4 = \omega/(\omega^2 + P^2)$.

Thus, it is seen that the optimizing functions for Z and P, namely equations 18 and 19, respectively, include both magnitude and phase components which are modified or adjusted or corresponding weighting functions.

Figure 3:
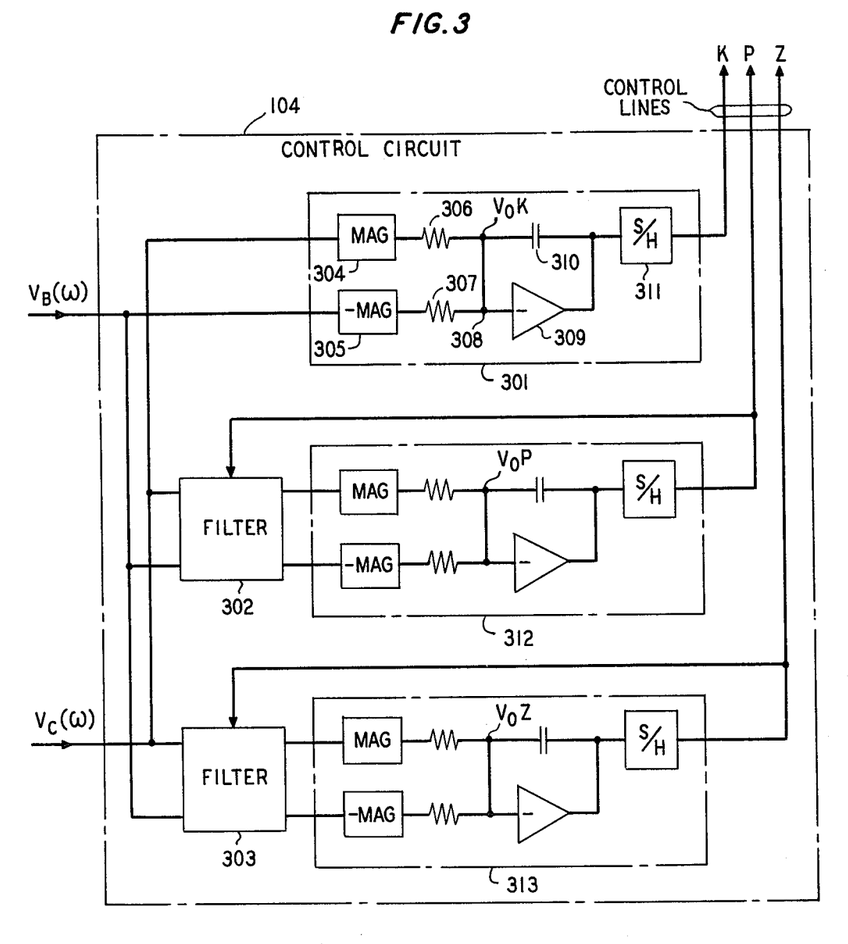
FIG. 3 illustrates details of the control circuit employed in the arrangement of FIG. 1.
Figure 4:
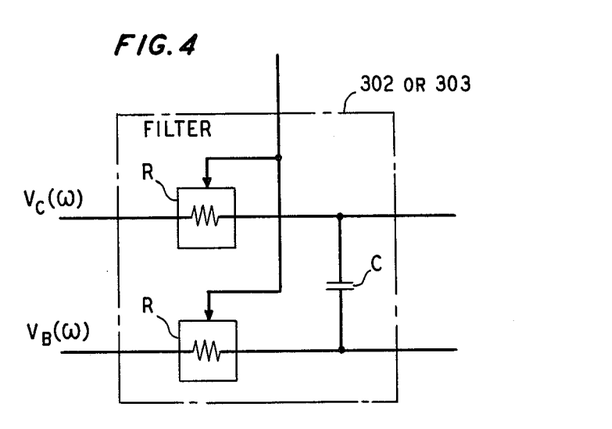
FIG. 4 shows details of a filter employed in the control circuit of FIG. 3.

Turning briefly to FIG. 3, it will be apparent to those skilled in the art that the signal $V_OK$ in circuit 301 is a measure of the function of the optimizing criteria for K in equation 17. Again, let us refer to FIGS. 3 and 4. By defining e to be ½ RC (FIG. 4) and by generating $\vec{V}_C(\omega)$ and $\vec{V}_B(\omega)$ which are band limited via filters 103 at the inputs to control circuit 104 from ports 1 and 3, respectively, of hybrid 101 (FIG. 1) in response to a signal from a noise source, it can be shown that $V_OP$ and $V_OZ$ of FIG. 3 may be expressed $$V_O \approx \int_{\omega_1}^{\omega_2} \left[ [|\vec{V}_C(\omega)| - |\vec{V}_B(\omega)|] W_5 - \kappa V_1 \theta(\omega) W_6 \right] d\omega \quad (20)$$

where $W_5 = e/(\omega^2 + e^2)$, $W_6 = \omega/(\omega^2 + e^2)$ and e is either Z or P. Equation 20 is substantially the same as the desired optimizing functions for Z and P expressed in equations 18 and 19, respectively. A single frequency source may also be employed in particular applications. However, for optimum adjustment over the band of interest a signal should be used which has a plurality of frequency components in the band. It is noted that bandpass filters 103 may be included in control circuit 104.

Returning now to FIG. 1, it is seen that by terminating port 4 of hybrid 101 in an infinite impedance, for example, an open circuit, and employing a signal source having approximately zero output impedance and at least one frequency component in the band of interest for signal source 110, which is connected via switch 108 to port 2, the desired optimizing functions may be generated by sensing $V_C(\omega)$ at port 1 and $V_B(\omega)$ at port 3. In this example, a noise source is employed for signal source 110 to obtain a test signal having a plurality of frequency components in the band of interest. Band limiting is obtained by employing bandpass filters 103, i.e., separate filters for $V_C(\omega)$ and $V_B(\omega)$. Consequently, control circuit 104 generates appropriate signals which are supplied via control lines K, P and Z to adjustable balance network 107. In turn, adjustable balance network 107 yields a driving point impedance which substantially matches bidirectional cable 102. Values for K, P and Z are sampled and held to maintain network 107 at the desired impedance and ports 2 and 4 are connected to unidirectional cables 105 and 106 for use as desired.

Signal source 110 may include a diode noise source which is employed with bandpass filters 103 to yield a desired Gaussian noise signal over a frequency band of interest. In the instant example, the frequency band is from approximately 250 Hz to 3600 Hz.

FIG. 2 shows details of an adjustable balance network which may be employed for network 107 of FIG. 1. This network has a variable scalar multiplier controlled by RK, a variable real pole controlled by RP and a variable real zero controlled by RZ, and a fixed real pole and a fixed real zero. That is to say, the locations in the frequency domain where the singularities P and Z occur are variable. This balance network is of a type employed to match the impedance of nonloaded telephone cable and is essentially identical to a network shown in FIG. 3 of U.S. Pat. No. 3,919,502, issued to G. T. Daryanani on Nov. 11, 1975 and described therein. The only differences between the network shown in the above-noted patent and the network shown in FIG. 2 herein being that RK, RP and RZ are controllably variable impedances, for example, resistors which are adjusted in response to control signals K, P and Z, respectively, generated by control circuit 104, whereas the resistors in the network shown in the noted patent are intended to be manually adjusted. Numerous arrangements known in the art may be employed to realize the adjustable impedances RK, RP and RZ, for example, field effect transistors may be employed to switch in or out resistors having appropriate resistance values.

FIG. 3 shows in simplified form details of control circuit 104. Circuit 104 responds to signals $V_B(\omega)$ and $V_C(\omega)$ from filters 103 (FIG. 1) to generate signals representative of control functions K, P and Z defined in equations 17, 18 and 19, respectively, for adjusting corresponding impedance elements in balance network 107 (FIG. 2). Accordingly, signals $V_B(\omega)$ and $V_C(\omega)$ are supplied to circuit 301, filter 302 and filter 303. Circuit 301 responds to $V_B(\omega)$ and $V_C(\omega)$ to generate a signal representative of control function K for controlling impedance RK in network 107. $V_C(\omega)$ is supplied to positive absolute magnitude circuit 304 while $V_B(\omega)$ is supplied to negative absolute magnitude circuit 305. Absolute magnitude circuits 304 and 305 may be any of those known in the art. Preferably, they are so-called precision magnitude circuits of a type employing operational amplifiers and diodes in appropriate feedback paths and poled to obtain the desired positive or negative absolute magnitude function. See, for example, an article entitled "A Simple Absolute-Value Amplifier" EDN, June 20, 1974, page 78, for a positive absolute magnitude circuit. Outputs from magnitude circuits 304 and 305 are supplied via resistors 306 and 307 to circuit point 308 where they are algebraically combined, i.e., summed, to yield signal $V_OK$. Signal $V_OK$ is supplied to an input of inverting amplifier 309. Capacitor 310 is connected in a feedback path between the output and input of amplifier 309 to form an integrator. Consequently, amplifier 309 yields a high gain to instantaneous changes in $V_OK$ as will be apparent to those skilled in the art. Preferably, amplifier 309 is a high gain differential amplifier of a type now commonly referred to as an operational amplifier. Thus, amplifier 309, associated resistors 306 and 307, and capacitor 310 form a summing integrator which, in conjunction with absolute magnitude circuits 304 and 305, generate a control signal representative of function K of the optimizing criterion of equation 17.

Sample and hold circuit 311 (S/H) either transfers its input signal, namely, $V_OK$, to its output or maintains at its output the last transferred signal. During the automatic balancing process of balance network 106, sample and hold 311 continuously transfers its input signal to its output. Upon achieving adjustment of balance network 106 to match the impedance of the bidirectional cable, sample and hold 311 is operative to maintain its last transferred signal. This allows for the disconnection of the adjustment circuit from hybrid 101 (FIG. 1) and operation of hybrid 101 for normal signal transmission. Sample and hold 311 may be either an analog circuit or a digital circuit. Numerous such arrangements are now well known in the art. A digital circuit may be implemented with an analog-to-digital converter and a storage register. The converter may be one which converts the analog output from amplifier 309 to an encoded digital output. A Gray code may be advantageously employed for this purpose. The Gray code converter includes a number of binary bits ordered from most significant to least significant representing a rounded-off value and a continuously varying residue signal which represents the difference in the actual value to the rounded-off value of the least significant bit of the encoded output. The Gray code output may be converted to conventional binary code and may be stored in a storage register and utilized to adjust continually impedance elements in balance network 107. The register output may, if desired, be converted to an analog signal for this purpose. An analog-to-Gray code converter which may be employed in S/H 311 is disclosed in U.S. Pat. No. 3,187,325 issued to F. D. Waldhauer on June 1, 1965, while a Gray-to-binary code converter is disclosed in my copending application Ser. No. 665,332, filed Mar. 9, 1976, now U.S. Pat. No. 4,055,841 issued on Oct. 25, 1977.

Circuits 312 and 313 are identical to circuit 301 except that the inputs to circuit 312 are outputs from filter 302 and the inputs to circuit 313 are outputs from filter 303. Each of filters 302 and 303 may be of any desired form as long as they, in conjunction with the magnitude and summing arrangements of circuits 312 and 313, yield output signals $V_OP$ and $V_OZ$, respectively, which are both of the form defined by equation 19. Preferably, filters 302 and 303 are each of a balanced lowpass type shown in FIG. 4. Filter 302 is employed in conjunction with circuit 312 to yield signal $V_OP$ which is representative of a signal for controlling corresponding impedance RP in balance network 106 to effect the optimizing function for real pole P. Filter 302 includes prescribed impedance values for R and C (FIG. 4) selected to realize a range of real pole values in the weighting functions $W_3$ and $W_4$ of equation 19. Similarly, filter 303, in conjunction with circuit 313, is employed to yield control signal $V_OZ$ which is representative of a signal for controlling corresponding impedance RZ in balance network 106 to effect the optimizing function for real zero Z. Here again, the component values employed in filter 303 are selected to obtain a range of values for Z of the weighting functions $W_1$ and $W_2$ of equation 18.

Since during the adjustment process, the frequency locations ($\omega = 2\pi f$) of the real pole and real zero vary as the impedances of network 107 are varied, the weighting functions for the pole and zero adjustments should also vary further to optimize the control functions P and Z, respectively. This is achieved by using variable impedance elements in each of filters 302 and 303 which respond to the outputs from the corresponding circuits 312 and 313, respectively. In practice, the time constants of filters 302 and 303 are adjusted to track the outputs from circuits 312 and 313, respectively. As indicated in equation 20 $e = \frac{1}{2} RC$ and $e = Z$ or P. Consequently, as Z or P varies RC should also vary. In one example from experimental practice, a filter is employed which has eight discrete resistance settings for R (FIG. 4) in each leg corresponding to binary 0 through 7. A decoder (not shown) responsive to the output from either circuit 312 or 313 is employed to generate outputs for controlling switching elements which either switch in or out various resistance values in order to track the corresponding output signal. Specifically, a digital decoder which responds to the digital output of an A/D converter is employed to control field effect transistor switching elements for inserting resistors of appropriate value in the legs of the balance filter. In one example from experimental practice, it has been determined that filter 303 employed in generating real zero control signal Z may have a fixed compromise characteristic. The component values for R and C are selected such that the location of Z in weighting functions $W_1$ and $W_2$ of equation 18 is selected to be the square root of $(Z_1) \times (Z_2)$, where $Z_1$ and $Z_2$ are the minimum and maximum zero locations, respectively.

FIG. 5 shows details of another adjustable balance network which may be employed for network 107 of FIG. 1. It is noted, however, that this balance network only has a variable scalar multiplier controlled by RK and a variable real zero controlled by RZ. This balance network is of a type employed to match the impedance of loaded telephone cable and is essentially identical to a network shown in FIG. 6 of U.S. Pat. No. 3,919,502, cited above, and described therein. The only differences between the network shown in the noted patent and the network shown in FIG. 5 being that RK and RZ are controllably variable impedances, for example, resistors which are adjusted in response to control signals K and Z, respectively, generated by control circuit 104, whereas resistors in the network shown in the noted patent are intended to be manually adjusted. Consequently, control circuit 104 (FIG. 3) need generate only control signals K and Z. Therefore, the circuit for generating control signal P (FIG. 3) may be eliminated. It has also been determined that a filter having a fixed compromise characteristic, which is the square root of the product of the minimum and maximum zero locations over the frequency band of interest, namely $(Z_1) \times (Z_2)$ is adequate for generating control signal Z in order to match satisfactorily loaded telephone cable over the frequency band of interest. However, if a closer or more optimum match is desired a filter having an adjustable characteristic may be employed in a fashion as described above.

The above-described arrangements are, of course, merely illustrative of the application of the principles of this invention. Numerous other arrangements may be devised by those skilled in the art without departing from the spirit and scope of the invention. Although the instant embodiments of the invention have been discussed in the context of employing a noise signal source, the techniques disclosed herein are equally applicable to a single frequency source, to a plurality of discrete frequency sources or to a swept frequency source within the band of interest.

What is claimed is:

1. In a transmission network of a type including a 4-port hybrid network adapted for being connected to a transmission path exhibiting a complex impedance at a first port and to an adjustable impedance balance network having a plurality of controllable impedance elements for yielding a driving point impedance at a second port, wherein the improvement comprises:
a signal source for generating a test signal having a plurality of frequency components within a predetermined frequency band and having a first prescribed output impedance, said signal source being adapted to be connected to a third port of said hybrid;

a second prescribed impedance being adapted to be connected to a fourth port of said hybrid; and a control circuit connected in circuit relationship with said first and second hybrid ports and being responsive to first and second signals developed at said first and second hybrid ports, respectively, in response to said test signal, said complex impedance of the transmission path and said balance network impedance for generating a plurality of control signals for adjusting said controllable impedance elements of said balance network to yield a driving point impedance to match substantially the complex impedance of said transmission path over said frequency band.

2. A transmission network as defined in claim 1 wherein said control circuit includes means for generating a magnitude control signal and at least a first singularity control signal over said frequency band.

3. A transmission network as defined in claim 2 wherein said magnitude control signal generating means includes means for generating a signal representative of the magnitude of said first signal, means for generating a signal representative of the magnitude of said second signal, means for combining said first and second magnitude signals in a prescribed manner and means for integrating said combined signals, said magnitude control signal represents the difference in the absolute magnitudes of said first and second signals integrated over the frequency band of interest.

4. A transmission network as defined in claim 2 wherein said at least first singularity control signal generating means generates a signal representative of the difference between a magnitude component equal to the difference between the absolute magnitudes of said first and second signals modified by a first prescribed weighting function, and a phase component proportionately equal to the difference between the phase of said first signal and said second signal modified by a second prescribed weighting function, integrated over the frequency band of interest.

5. A transmission network as defined in claim 4 wherein said at least first singularity control signal generating means includes first filter means responsive to said first and second signals for generating first and second outputs, first means for generating a signal representative of the magnitude of said first output, second means for generating a signal representative of the magnitude of said second output, means for combining said first and second magnitude signals in a prescribed manner, and means for integrating said combined signal to yield said at least first singularity control signal.

6. A transmission network as defined in claim 5 wherein said first filter means includes a balanced low-pass filter having a prescribed frequency characteristic.

7. A transmission network as defined in claim 6 wherein said low-pass filter means includes means for controllably varying said frequency characteristic in a prescribed relationship with said at least first singularity control signal.

8. A transmission network as defined in claim 6 wherein said low-pass filter means has a predetermined characteristic having a time constant determined by the component values of resistor means (R) in each of two input legs shunted by capacitor means (C) across two output legs wherein the time constant $\frac{1}{2}$ RC is selected to be equal to the square root of the product of the minimum value of said at least first singularity and the maximum value of said at least first singularity in said frequency band.

9. A transmission network as defined in claim 4 wherein said control circuit includes means for generating an at least second singularity control signal over said frequency band, said at least second singularity control signal generating means generates a signal representative of the difference between a magnitude component equal to the difference between the absolute magnitudes of said first and second signals modified by a third prescribed weighting function, and a phase component proportionately equal to the difference between the phase of said first signal and said second signal modified by a fourth prescribed weighting function, integrated over the frequency band of interest.

10. A transmission network as defined in claim 9 wherein said first prescribed impedance value is substantially zero and wherein said second prescribed impedance value is substantially infinite, for example, an open circuit.

11. A transmission network as defined in claim 10 wherein said transmission network further includes means for limiting signals supplied to said control circuit to be within said frequency band of interest.

12. A transmission network as defined in claim 11 wherein said signal source includes a noise source.

13. In a transmission network of a type including a 4-port hybrid network adapted for being connected to a transmission path exhibiting a complex impedance at a first port and to an adjustable impedance balance network having a plurality of controllable impedance elements for yielding a driving point impedance at a second port, wherein the improvement comprises:

a signal source for generating a test signal having at least one frequency component within a predetermined frequency band; and a control circuit connected in circuit relationship with said first and second hybrid ports and being responsive to first and second signals developed at said first and second hybrid ports, respectively, in response to said test signal, said complex impedance of the transmission path and said balance network impedance for generating a plurality of control signals for adapting said controllable impedance elements of said balance network to yield a driving point impedance to match substantially the complex impedance of said transmission path, said control circuit including means for generating a magnitude control signal and means for generating at least a first singularity control signal, said at least first singularity control signal generating means generates a signal representative of the integral of the difference between a magnitude component equal to the difference between the absolute magnitudes of said first and second signals modified by a first prescribed weighting function, and a phase component proportionately equal to the difference between the phase of said first signal and said second signal modified by a second prescribed weighting function.

14. A transmission network as defined in claim 13 wherein said control circuit further includes means for generating an at least second singularity control signal, said at least second singularity control signal generating means generates a signal representative of the integral of the difference between a magnitude component equal to the difference between the absolute magnitudes of said first and second signals modified by a third prescribed weighting function, and a phase component proportionately equal to the difference between the phase of said first signal and said second signal modified by a fourth prescribed weighting function.

15. A transmission network as defined in claim 14 wherein each of said at least first and second singularity control signal generating means includes balanced low-pass filter means responsive to said first and second signals for yielding first and second outputs, first means responsive to said first output for generating a signal representative of the absolute magnitude of said first output, second means responsive to said second output for generating a signal representative of the absolute magnitude of said second output, means for obtaining the difference between said first and second magnitude signals, and means for integrating said difference signal.

16. A transmission network as defined in claim 15 wherein said test signal source has a first prescribed output impedance and further including a second prescribed impedance being adapted to be connected to a fourth port of said hybrid.

17. A transmission network as defined in claim 16 wherein said first prescribed impedance is substantially zero and wherein said second prescribed impedance is substantially infinite, for example, an open circuit.

* * * * *